(12) United States Patent
Opsal et al.

(10) Patent No.: US 6,429,943 B1
(45) Date of Patent: Aug. 6, 2002

(54) CRITICAL DIMENSION ANALYSIS WITH SIMULTANEOUS MULTIPLE ANGLE OF INCIDENCE MEASUREMENTS

(75) Inventors: Jon Opsal, Livermore; Allan Rosencwaig, Danville, both of CA (US)

(73) Assignee: Therma-Wave, Inc., Fremont, CA (US)

( * ) Notice: Subject to any disclaimer, the term of this patent is extended or adjusted under 35 U.S.C. 154(b) by 0 days.

(21) Appl. No.: 09/818,703
(22) Filed: Mar. 27, 2001

Related U.S. Application Data
(60) Provisional application No. 60/192,899, filed on Mar. 29, 2000.

(51) Int. Cl.$^7$ .............................................. C01B 11/14
(52) U.S. Cl. ....................... 356/625; 356/636
(58) Field of Search ................ 356/636, 512, 356/513, 514, 625

(56) References Cited

U.S. PATENT DOCUMENTS

| | | | |
|---|---|---|---|
| 4,200,396 A | * 4/1980 | Kleinknecht et al. | 356/636 |
| 4,408,884 A | * 10/1983 | Kleinknecht et al. | 356/496 |
| 4,999,014 A | 3/1991 | Gold et al. | 356/382 |
| 5,042,951 A | 8/1991 | Gold et al. | 356/369 |
| 5,159,412 A | 10/1992 | Willenborg e tal. | 356/445 |
| 5,412,473 A | 5/1995 | Rosencwaig et al. | 356/351 |
| 5,739,909 A | 4/1998 | Blayo et al | 356/369 |
| 5,830,611 A | 11/1998 | Bishop et al. | 430/30 |
| 5,867,276 A | 2/1999 | McNeil et al. | 356/445 |
| 5,889,593 A | 3/1999 | Bareket | 356/445 |
| 5,917,594 A | * 6/1999 | Norton | 356/327 |
| 6,137,570 A | 10/2000 | Chuang et al. | 356/237.5 |

FOREIGN PATENT DOCUMENTS

| | | | |
|---|---|---|---|
| WO | WO 99/02970 | 1/1999 | G01N/21/21 |
| WO | WO 99/45340 | 9/1999 | G01B/11/02 |

OTHER PUBLICATIONS

J. Bao et al., "Specular Spectral Profilometry on Metal Layers," (Seminar Proceedings: Metrology, Inspection, and Process Control for Microlithography XIV) *Proceedings of SPIE*, vol. 3998, 2000, pp. 882–892.

C.J. Raymond et al., "Multi–parameter process metrology using scatterometry," *SPIE*, vol. 2638, 1995, pp. 84–93.

M.R. Murnane et al., Scatterometry for 0.24 $\mu$m—0.70 $\mu$m developed photoresis metrology, *SPIE*, vol. 2439, 1995, pp. 427–436.

P.A. Heimann et al., "Optical Etch–Rate Monitoring: Computer Simulation of Reflectance," *J. Electrochem. Soc.*, vol. 131, No. 4, Apr. 1984, pp. 881–885.

P.A. Heimann, "Optical Etch–Rate Monitoring Using Active Device Areas: Lateral Interference Effects,"*J. Electrochem. Soc.*, vol. 132, No. 8, Aug. 1985, pp. 2003–2006.

* cited by examiner

*Primary Examiner*—Richard A. Rosenberger
(74) *Attorney, Agent, or Firm*—Stallman & Pollock LLP

(57) ABSTRACT

A method and apparatus are disclosed for evaluating relatively small periodic structures formed on semiconductor samples. In this approach, a light source generates a probe beam which is directed to the sample. In one preferred embodiment, an incoherent light source is used. A lens is used to focus the probe beam on the sample in a manner so that rays within the probe beam create a spread of angles of incidence. The size of the probe beam spot on the sample is larger than the spacing between the features of the periodic structure so some of the light is scattered from the structure. A detector is provided for monitoring the reflected and scattered light. The detector includes multiple detector elements arranged so that multiple output signals are generated simultaneously and correspond to multiple angles of incidence. The output signals are supplied to a processor which analyzes the signals according to a scattering model which permits evaluation of the geometry of the periodic structure. In one embodiment, the sample is scanned with respect to the probe beam and output signals are generated as a function of position of the probe beam spot.

84 Claims, 2 Drawing Sheets

CRITICAL DIMENSION ANALYSIS WITH SIMULTANEOUS MULTIPLE ANGLE OF INCIDENCE MEASUREMENTS

PRIORITY

This application claims priority from prior provisional application Ser. No. 60/192,899 filed Mar. 29, 2000.

TECHNICAL FIELD

The subject invention relates to optical metrology equipment for measuring critical dimensions and feature profiles of periodic structures on semiconductor wafers. The invention is implemented using data obtained from simultaneous multiple angle of incidence measurements as an input to analytical software designed to evaluate surface features via a specular scatterometry approach.

BACKGROUND OF THE INVENTION

There is considerable interest in the semiconductor industry in evaluating small features of periodic structures on the surface of a sample. In current high density semiconductor chips, line widths or feature sizes are as small as 0.1 microns. These feature sizes are too small to be measured directly with conventional optical approaches. This is so because the line widths are smaller than the probe beam spot size which can be achieved with most focusing systems.

This problem is illustrated in FIG. 1 which shows a wafer 10 having formed thereon a number of conductive lines 12. A probe beam 14 is shown focused by a lens 20 onto the sample at a spot 16. The reflected beam is measured by a photodetector 18. As can be seen, spot 16 overlaps multiple lines 12 and therefore cannot be used to measure distances between lines or the thickness of the lines themselves.

To overcome this problem, sophisticated software programs have been developed which analyze the reflected probe beam in terms of a scattering model. More specifically, it is understood that critical dimensions or feature profiles on the surface of the wafer will cause some level of scattering of the reflected probe beam light. If this scattering pattern is analyzed, information about the critical dimensions can be derived. This approach has been called specular scatterometry. The algorithms use various forms of modeling approaches including treating the lines as an optical grating. These algorithms attempt to determine the geometry of the periodic structure.

FIG. 2 schematically illustrates the geometry of one type of periodic structure 24. This periodic structure can be analyzed in terms of the width W between the features and the depth D of the grooves. In addition, the shape or profile P of the side walls of the features can also be analyzed by the current algorithms operating on the analytical data.

To date, these analytical programs have been used with data taken from conventional spectroscopic reflectometry or spectroscopic ellipsometry devices. In addition, some efforts have been made to extend this approach to analyzing data from simultaneous multiple angle of incidence systems. In these systems, the spot size is relatively small, but still larger than the individual features of the periodic structure. Paradoxically, where the features are only slightly smaller than the spot size, analysis through scatterometry is difficult since not enough of the repeating structure is covered by the spot. Accordingly, it would be desirable to modify the system so a sufficient number of individual features are measured so a good statistically based, scatterometry analysis can be performed.

SUMMARY OF THE INVENTION

The assignee of the subject invention has previously developed simultaneous multiple angle of incidence measurement tools which have been used to derive characteristics of thin films on semiconductor wafers. It is believed that data from the same type of tools can be used with an appropriate scattering model analysis to determine critical dimensions and feature profiles on semiconductors.

Detailed descriptions of assignee's simultaneous multiple angle of incidence devices can be found in the following U.S. Pat. Nos.: 4,999,014; 5,042,951; 5,181,080; 5,412,473 and 5,596,411, all incorporated herein by reference. The assignee manufactures a commercial device, the Opti-Probe which takes advantage of some of these simultaneous, multiple angle of incidence systems. A summary of all of the metrology devices found in the Opti-Probe can be found in PCT application WO/9902970, published Jan. 21, 1999.

One of these simultaneous multiple angle of incidence tools is marketed by the assignee under the name beam profile reflectometer (BPR). In this tool, a probe beam is focused with a strong lens so that the rays within the probe beam strike the sample at multiple angles of incidence. The reflected beam is directed to an array photodetector. The intensity of the reflected beam as a function of radial position within the beam is measured and includes not only the specularly reflected light but also the light that has been scattered into that detection angle from all of the incident angles as well. Thus, the radial positions of the rays in the beam illuminating the detector correspond to different angles of incidence on the sample plus the integrated scattering from all of the angles of incidence contained in the incident beam. In this manner, simultaneous multiple angle of incidence reflectometry can be performed.

Another tool used by the assignee is known as beam profile ellipsometry. In one embodiment as shown and described in U.S. Pat. No. 5,042,951, the arrangement is similar to that described for BPR except that additional polarizers and/or analyzers are provided. In this arrangement, the change in polarization state of the various rays within the probe beam are monitored as a function of angle of incidence.

It is believed that the data generated by either of these tools could be used to appropriately model and analyze critical dimensions and feature profiles on semiconductors.

The lens used to create the probe beam spot from a laser source in the above two simultaneous multiple angle of incidence systems is typically larger than the distance between adjacent features of the periodic structure of interest. However, in order to provide statistically significant information, it is desirable that information be collected from at least twenty or more of the repeating features. One method of achieving this goal is to increase the spot size of the probe beam. Such an approach is described in U.S. Pat. No. 5,889,593 incorporated by reference. In this patent, a proposal is made to include an optical imaging array for breaking up the coherent light bundles to create a larger spot.

It is believed the latter approach is not desirable because of the additional complexity it introduces into the measurement. Ideally, when attempting to analyze a periodic structure (e.g., a periodic critical dimension array) it is desirable to have no additional periodicities in the measurement system between the source and detector. Multiple periodic signals are more difficult to analyze and are often plagued with added uncertainty and ambiguity with respect to extracting parameters associated with any of the constituent components.

In accordance with the subject invention, the requirement for increasing the area over which measurements are taken is achieved in two different ways. In the first approach, the probe beam spot is scanned over the wafer until a sufficient amount of data are taken. Once the data are taken, a spatial averaging algorithm is utilized. Spatial averaging is discussed in U.S. patent application, Ser. No. 09/658,812, filed Sep. 11, 2000 and incorporated herein by reference. In another approach, the probe beam is generated by an incoherent or white light source. When incoherent light is focused by a lens, the spot size will be significantly larger than with a laser. No separate imaging array needs to be included to break up the coherence of the light as in the prior art. In such a system, a monochrometer could be located between the light source and the detector to permit measurement of a narrow band of wavelengths. The wavelength selected can be matched to the type of sample being inspected in order to obtain the most statistically relevant data. In addition, it would also be possible to scan the monochrometer in order to capture data at multiple wavelengths. It would also be possible to measure multiple wavelengths simultaneously as described in U.S. Pat. No. 5,412,473.

Alternatively or in addition, the measurement data which can be obtained from two or more metrology devices of the type described in the above identified PCT application, could be used to advance this analysis. As more of these metrology devices are added, the ability to unambiguously distinguish features increases. Thus, it is within the scope of the subject invention to utilize either or both of a simultaneous multiple angle of incidence spectrometer or ellipsometer along with one or more of spectroscopic reflectometry, spectroscopic ellipsometry or absolute ellipsometry tools with the latter two being deployed in a manner that maximizes the information content of the measurement. For example, with a rotating compensator spectroscopic ellipsometer one measures both the sign and magnitude of the ellipsometric phase while in more standard configurations, e.g., a rotating polarizer/rotating analyzer, only the magnitude or phase can be measured.

An example of an analytical approach for evaluating critical dimensions using data from a broadband reflectometer is described in "In-situ Metrology for Deep Ultraviolet Lithography Process Control," Jakatdar et. al. SPIE Vol. 3332, pp. 262–270 1998. An example of using a spectroscopic ellipsometer equipment for CD metrology is described in, "Specular Spectroscopic Scatterometry in DUV Lithography, SPIE Vol. 3677, pp 159–168, from the SPIE Conference on Metrology, Inspection and Process Control for Microlithography XIII, Santa Clara, Calif., March 1999.

Further and related information measuring critical dimensions can be found in U.S. Pat. No. 5,830,611 and 5,867,276, incorporated herein by reference.

DETAILED DESCRIPTION OF THE PREFERRED EMBODIMENTS

Figure 1:
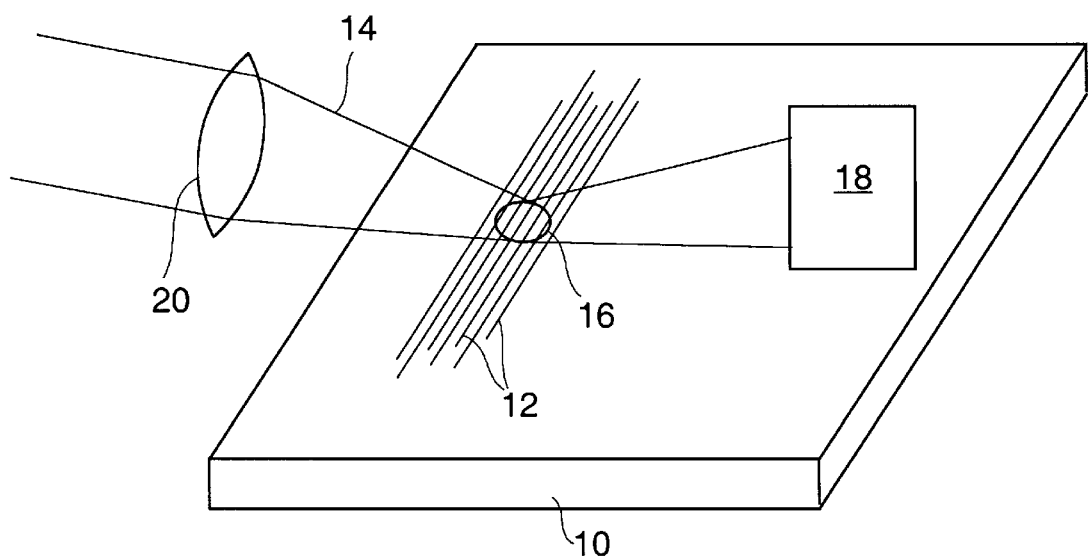
FIG. 1 is schematic diagram illustrating the optical measurement of periodic structure on a sample.
Figure 2:
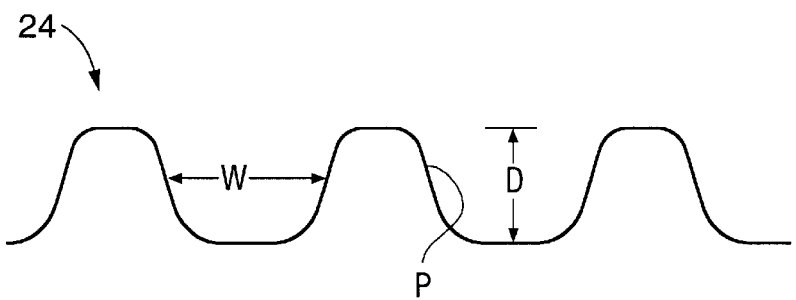
FIG. 2 is a cross-sectional illustration of the type of periodic structure which can be measured in accordance with the subject invention.
Figure 3:
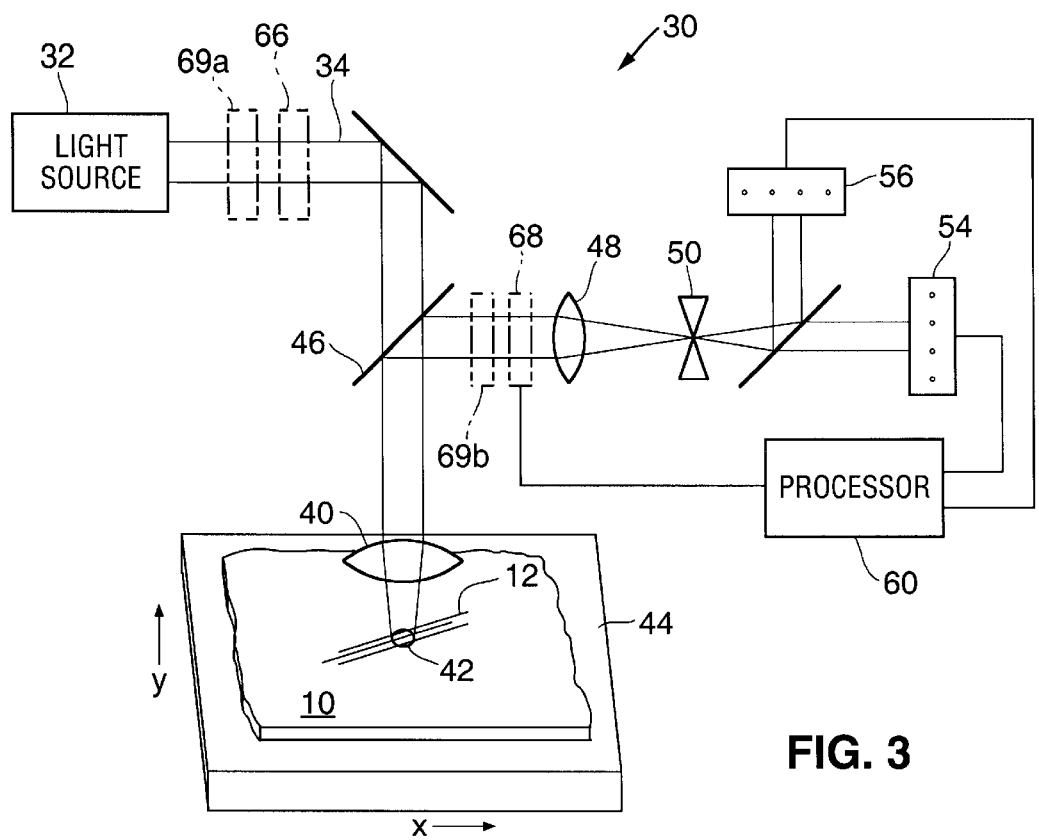
FIG. 3 is a schematic diagram of an apparatus for performing the method of the subject invention.

Turning to FIG. 3, a basic schematic of simultaneous multiple angle of incidence apparatus 30 is illustrated, Further details about such a device are described in U.S. Pat. Nos. 4,999,014; 5,042,951; 5,159,412 and 5,412,473 all incorporated herein by reference. As noted above, the assignee's Opti-Probe device incorporates portions of this technology and markets the measurement subsystem under the trademark Beam Profile Reflectometry or BPR. In the past, the BPR technology was utilized primarily to analyze the characteristics of thin films formed on semiconductors. This disclosure is directed to using the measurements which can be obtained from this type of system to evaluate the geometry of periodic structures formed on semiconductors.

The basic measurement system includes a light source 32 for generating a probe beam 34. The light source can be a laser for generating a coherent beam of radiation. Laser diodes are suitable laser sources for this application. If the output of the laser is not itself polarized, a separate linear polarizer can be provided. As discussed below, light source 32 can also be a polychromatic or white light source for generating a probe beam with a plurality of wavelengths.

The probe beam 34 is focused onto the sample 10 using a lens 40 in a manner so that the rays within the probe beam create a spread of angles of incidence. In the preferred embodiment, the beam is directed normal to the surface but can be arranged off-axis as illustrated in U.S. Pat. No. 5,166,752, incorporated by reference. Lens 40 is preferably a high numerical aperture lens (on the order of 0.90) to create angles of incidence from zero to about 70 degrees. The lens creates rays having predominantly S-polarized light along one axis and predominantly P-polarized light along an orthogonal axis. At intermediate angles, the polarization is mixed.

Lens 40 is positioned to create a probe beam spot 42 on the sample on the order of about 1 micron in diameter where the light source is coherent (i.e. a laser source). This spot is typically somewhat larger than the spacing (width W) between the recurring features of the periodic structure. For this reason, a certain portion of the light from the probe beam will be diffracted or scattered from the periodic structure. As discussed below, this light can be analyzed with a scattering model in a manner similar to prior art probe beam detection scatterometry systems. The advantage of the subject approach is that the data can be simultaneously obtained from a plurality of angles of incidence.

In order to obtain data sufficient to perform an accurate evaluation, it is preferable that the probe beam collect information from at least 20 repeating features in the pattern. If the probe beam spot 42 is not sufficiently large, than it would be desirable to scan the probe beam over the surface of the sample in the region of the periodic structure. This can be accomplished by moving an X-Y stage 44 upon which the sample rests. It would also be possible to provide scanning capability to the probe beam itself. Scanning would preferably be in a direction perpendicular to the parallel features of the periodic structure. Data is generated as a function of the position of the probe beam spot with respect to the features of the periodic structure. Where the sample is scanned, the data is analyzed as discussed above and further clarified using a spatial averaging algorithm. In this spatial averaging approach, the data from points in the scan are filtered by a repeated sequence of averaging and outlier exclusions where the outliers are defined by their differences with respect to signal levels and symmetry properties. The result of this process leads to data that are equivalent to those taken with an incoherent source illuminating an area the same as that scanned in the spatial averaging approach.

The reflected/scattered beam passes back up through the lens 40 which collimates the beam. The reflected beam is redirected by a splitter to an imaging lens 48. Lens 48 magnifies and relays an image of the sample at the focal plane of the lens. A spatial filter 50 having an aperture is placed in the focal plane of the lens 48 for controlling size of the area of the sample which is measured.

The probe beam is than passed through a 50—50 splitter and directed to two photodetectors 54 and 56 having a linear array of detector elements. The photodetectors are arranged orthogonal to each other to measure both the S and P polarization components. As described in detail in the above cited patents, each of the detecting elements in the array measure different angles of incidence. The radial position within the reflected probe beam is mapped to the angle of incidence, with the rays closer to the center of the beam having the smallest angles of incidence and the rays in the radially outer portion of the beam corresponding to the greatest angles of incidence. Thus, each detector element simultaneously generates an independent signals that correspond to a different angle of incidence.

The output signals from the detector arrays are supplied to the processor 60. Processor will analyze the signals based on algorithm which considers the reflected and scattered light such as a rigorous coupled wave analysis. The selected algorithm will correlate the variation in reflectivity as a function of angle of incidence with the geometry of the periodic structure. Such scattered light theoretical models are well known in the literature. In addition to the articles cited above, further examples can be found in the following articles which are cited by way of example. Those skilled in the art of analyzing signals diffracted from periodic structures will understand that there are many other approaches which can be utilized. It should be noted that since this approach obtains measurements at multiple angles of incidence, higher order diffraction effects may be collected and considered.

Prior articles:
1. "Optical Etch-Rate Monitoring: Computer Simulation of Reflectance," Heimann and Schultz, *J. Electrochem. Soc: Solid State Science and Technology*, April 1984, Vol. 131, No. 4, page 881
2. "Optical Etch-Rate Monitoring Using Active Device Areas: Lateral Interference Effects", Heimann, *J. Electrochem. Soc: Solid State Science and Technology*, August 1985, Vol. 132, No. 8, page 2003.
3. "Scatterometry for 0.24 micron–0.70 micron developed photoresist metrology," Murnane et. al. *SPIE*, Vol. 2439, page 427 (1995).
4. "Multi-Parameter Process metrology using scatterometry," Raymond et. al. *SPIE* Vol. 2638, page 84 (1995).
5. "Specular Spectral Profilometry on Metal Layers," Bao et. al, *SPIE* Vol 3998 (2000), page 882.

The type of analysis will depend on the application. For example, when used for process control, either in situ or near real time, the processor can compare the detected signals to an expected set of signals corresponding to the desired geometry of the periodic structure. If the detected signals do not match the expected signals, it is an indication that the process is not falling within the specified tolerances and should be terminated and investigated. In this approach, no sophisticated real time analysis of the signals is necessary.

As is known in the art, the reflected output signals at multiple angles of incidence can be more rigorously analyzed to determine the specific geometry of the periodic structure. While there are a number of different approaches, most have certain traits in common. More specifically, the analytical approach will typically start with a theoretical "best guess" of the geometry of the measured structure. Using Fresnel equations covering both the reflection and scattering of light, calculations are made to determine what the expected measured output signals would be at different angles of incidence for the theoretical geometry. These theoretical output signals are compared to the actual measured output signals and the differences noted. Based on the differences, the processor will generate a new set of theoretical output signals corresponding to a different theoretical periodic structure. Another comparison is made to determine if the theoretical signals are closer to the actual measured signals. These generation and comparison steps are repeated until the differences between the theoretically generated data and the actually measured data are substantially minimized. Once the differences have been minimized, the theoretical periodic structure corresponding to the best fit theoretical data is assumed to represent the actual periodic structure.

This minimization procedure can be carried out with a conventional least squares fitting routine such as a Levenberg-Marquardt algorithm. It would also be possible to use a genetic algorithm. (See, U.S. Pat. No. 5,953,446.)

In the past, this type of rigorous analysis was limited to the research environment, since the calculations necessary to determine the periodic structure was extremely complex and time consuming. However, with advent of faster and parallel processing technologies, it is believed that such an analytical approach could be used in a real time analysis.

One method for reducing the computer processing time during measurement activities is to create a library of possible solutions in advance. (See the Jakatdar articles, cited above). In this approach, a range of possible periodic structures and their associated theoretical output signals are generated in advance using the Fresnel equations as discussed above. The results are stored as a library in a processor memory. During the measurement activities, the actual measured signals are compared with sets of theoretically generated output signals stored in the library. The periodic structure associated with the set of theoretical signals which most closely matches the actual measured data is assumed to most closely represent the geometry of the measured periodic structure.

The simultaneous multiple angle approach is not limited to reflectometry. As noted in U.S. Pat. Nos. 5,042,951 and 5,166,752 (incorporated herein by reference), it is also possible to obtain ellipsometric measurements corresponding to W and A simultaneously at multiple angles of incidence. To obtain such measurements, some additional optical elements should be added to the device of FIG. 3. For example, a polarizer 66 (shown in phantom) is desirable to accurately predetermine the polarization state of the probe beam. On the detection side, an analyzer 68 (also shown in phantom) is provided to aid in analyzing the change in polarization state of the probe beam due to interaction with the sample. The optical components of the analyzer can be of any type typically used in an ellipsometer such as a polarizer or a retarder. The ellipsometric output signals are analyzed in a fashion similar to the prior art approaches for using ellipsometric data to evaluate the geometry of periodic structures.

Another approach to increasing the size of the probe beam spot is to use an incoherent source for the probe beam. Such an incoherent source can include a variety of well known spectral line or broad band sources. If a spectral line light source is used, some modest level of narrow pass filtering may be desirable. Such a filter could be located either before the sample or before the detector as indicated in phantom lines 69a and 69b. The wavelength which is used is selected in order to maximize the sensitivity in the reflection response to the type of changes of interest.

It would also be possible to use a broadband or white light source generating a polychromatic beam. In this situation, the wavelength selective filter could be in the form of a conventional monochrometer. A monochrometer, which typically includes a dispersive element and a slit, functions to transmit a narrow band of wavelengths. The system could be arranged to take measurements at only one wavelength or in a series of sequential wavelengths as the monochrometer is tuned. The use of an incoherent light source would fill the field of view on the sample (typically 100 microns or more for a 0.9 NA microscope objective). The actual measurement spot size is controlled by an aperture that can be varied in size as needed for the particular measurement in question. Such variable spatial filtering is described in U.S. Pat. No. 5,412,473.

Figure 4:
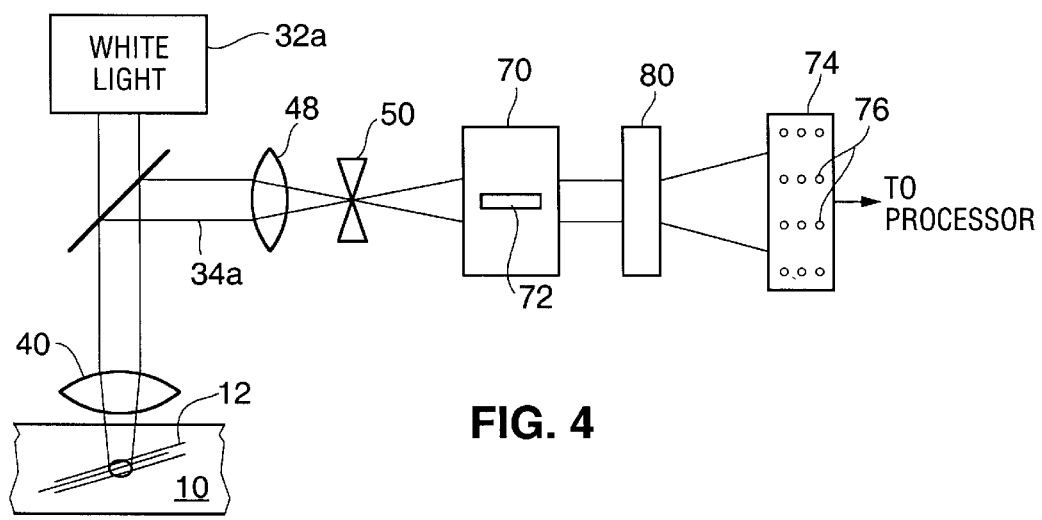
FIG. 4 is a schematic diagram illustrating an alternate embodiment of the subject apparatus for performing spectroscopic measurements.

It would also be possible to set up a system where both the multiple angle and multiple wavelength information is obtained simultaneously. Such a detection scheme is also described in detail in U.S. Pat. No. 5,412,473, incorporated by reference. This detection scheme is briefly described herein with reference to FIG. 4.

In this embodiment, the probe beam 34a is a broadband polychromatic beam generated by a white light source 32a generating an incoherent probe beam. There are a number of white light sources available such as tungsten or deuterium bulbs. The probe beam 34a is focused on the sample with lens 40. Upon reflection, the probe beam is passed through relay lens 48 and spatial filter 50 in the manner described above. In addition, the beam is passed through a filter 70 having an slit 72 located in the relay image plane of the exit pupil of lens 40. Lens 48 also serves to relay this image. The slit is dimensioned so that image transmitted to the detector 74 will be on the order of the dimensions of a row of detector elements 76.

After the beam passes through the slit, it is dispersed as a function of wavelength by element 80. Any conventional wavelength dispersing element can be used, such as a grating, prism or holographic plate.

The dispersed beam is directed to the detector which is a two dimensional array of photodiodes. A CCD element could also be used. The slit 72 is oriented perpendicular to the axis of the dispersion of the light. In this matter, each horizontal row of elements on the array 74 will measure a narrow wavelength band of light. Each of the elements in each row correspond to different angles of incidence. Thus, the output of the detector 74 will simultaneously produce data for multiple wavelengths and multiple angles of incidence. As noted in U.S. Pat. No. 5,412,473, this type of detection system can be used for either reflectometry or ellipsometry measurements.

It is also within the scope of the subject invention to combine these measurements with other measurements that might be available from a composite tool. As noted above, the assignee's Opti-Probe device (as described in WO 99/02970) has multiple measurement technologies in addition to the Beam Profile Reflectometry system. These other technologies include broadband reflectometry and broadband ellipsometry. The output from these additional modules can be used in combination with the BPR signals to more accurately evaluate the geometry of the periodic structures.

In summary, there has been described a method and apparatus for evaluating relatively small periodic structures formed on semiconductor samples. In this approach, a light source generates a probe beam which is directed to the sample. In one embodiment, the light source generates incoherent light. A lens is used to focus the probe beam on the sample in a manner so that rays within the probe beam create a spread of angles of incidence. The size of the probe beam spot on the sample is larger than the spacing between the features of the periodic structure so some of the light is scattered from the structure. A detector is provided for monitoring the reflected and scattered light. The detector includes multiple detector elements arranged so that multiple output signals are generated simultaneously and correspond to multiple angles of incidence. The output signals are supplied to a processor which analyzes the signals according to a scattering model which permits evaluation of the geometry of the periodic structure. Both single and multiple wavelength embodiments are disclosed.

While the subject invention has been described with reference to a preferred embodiment, various changes and modifications could be made therein, by one skilled in the art, without varying from the scope and spirit of the subject invention as defined by the appended claims.

We claim:

1. An apparatus for evaluating the geometry of a periodic structure formed on a sample comprising:

an incoherent light source for generating a probe beam;

an optical element for focusing the probe beam to a spot on the sample surface in a manner so that the rays within the probe beam create a spread of angles of incidence and wherein the spot size on the sample is larger than the spacing between the features of the periodic structure so that the probe beam is diffracted upon reflection;

a detector array for monitoring the light of the probe beam diffracted from the periodic structure, said detector array simultaneously generating a plurality of independent output signals corresponding to a plurality of different angles of incidence; and a processor for evaluating the geometry of the periodic structure on the sample based on the output signals generated by the detector.

2. An apparatus as recited in claim 1 wherein said light source is polychromatic.

3. An apparatus as recited in claim 2 further including a wavelength selective filter located between the light source and the detector array.

4. An apparatus as recited in claim 3 wherein said wavelength selective filter is a monochrometer.

5. An apparatus as recited in claim 4 wherein the detector array generates output signals corresponding to a plurality of wavelengths.

6. An apparatus as recited in claim 2 further including a dispersive element for spreading the wavelengths of light in the probe beam being diffracted from the sample and wherein the detector array is arranged to simultaneously generate output signals at multiple wavelengths.

7. An apparatus as recited in claim 1 wherein at least twenty repetitive features of the periodic structure are imaged by the detector array.

8. An apparatus as recited in claim 1 wherein the size of the probe beam spot is illuminates at least twenty repetitive features of the periodic structure.

9. An apparatus as recited in claim 1 further including an analyzer and wherein the processor determines the change in polarization state of the rays within the probe beam to evaluate the geometry of the periodic structure on the sample.

10. An apparatus as recited in claim 1 wherein the optical element for focusing the probe beam is a lens.

11. An apparatus as recited in claim 1 wherein the probe beam is directed substantially normal to the sample.

12. An apparatus as recited in claim 1 wherein the processor functions to generate a set of theoretical output signals based on a theoretical profile of the periodic structure and wherein the theoretical output signals are compared with the actual output signals and thereafter, the processor generates another set of theoretical output signals based on the comparison and using a different theoretical profile of the periodic structure and wherein the comparison and generation steps are repeated until the differences between the theoretical output signals and the actual output signals are minimized.

13. An apparatus as recited in claim 1 wherein the processor compares the output signals to a set of previously generated theoretical output signals to find the closest match and wherein each one of the set of previously generated output signals corresponds to a different possible geometry of the periodic structure.

14. An apparatus as recited in claim 1 wherein the processor compares the output signals to a predetermined set of output signals to determine if a process is within specified tolerances.

15. An apparatus as recited in claim 1 wherein the probe beam spot is scanned with respect to the periodic structure and output signals are generated as a function of position.

16. An apparatus as recited in claim 15 wherein said processor filters the output signals generated during the scan using a repeated sequence of averaging and outlier exclusions wherein the outliers are defined by their differences with respect to signal levels and symmetry properties.

17. An apparatus for evaluating the geometry of a periodic structure formed on a sample comprising:

an incoherent light source for generating a probe beam;

an optical element for focusing the probe beam to a spot on the sample surface in a manner so that the rays within the probe beam create a spread of angles of incidence and wherein the spot size on the sample is larger than the spacing between the features of the periodic structure so that the probe beam is diffracted upon reflection;

detector means for monitoring the light of the probe beam diffracted from the periodic structure, said detector means for simultaneously generating a plurality of independent output signals corresponding to a plurality of different angles of incidence; and a processor for evaluating the geometry of the periodic structure on the sample based on the output signals generated by the detector.

18. An apparatus as recited in claim 17 wherein said light source is polychromatic.

19. An apparatus as recited in claim 18 further including a wavelength selective filter located between the light source and the detector means.

20. An apparatus as recited in claim 19 wherein said wavelength selective filter is a monochrometer.

21. An apparatus as recited in claim 20 wherein the detector means generates output signals corresponding to a plurality of wavelengths.

22. An apparatus as recited in claim 18 further including a dispersive element for spreading the wavelengths of light in the probe beam being diffracted from the sample and wherein the detector means is arranged to simultaneously generate output signals at multiple wavelengths.

23. An apparatus as recited in claim 17 wherein at least twenty repetitive features of the periodic structure are imaged by the detector means.

24. An apparatus as recited in claim 17 wherein the size of the probe beam spot is illuminates at least twenty repetitive features of the periodic structure.

25. An apparatus as recited in claim 17 further including an analyzer and wherein the processor determines the change in polarization state of the rays within the probe beam to evaluate the geometry of the periodic structure on the sample.

26. An apparatus as recited in claim 17 wherein the optical element for focusing the probe beam is a lens.

27. An apparatus as recited in claim 17 wherein the probe beam is directed substantially normal to the sample.

28. An apparatus as recited in claim 17 wherein the processor functions to generate a set of theoretical output signals based on a theoretical profile of the periodic structure and wherein the theoretical output signals are compared with the actual output signals and thereafter, the processor generates another set of theoretical output signals based on the comparison and using a different theoretical profile of the periodic structure and wherein the comparison and generation steps are repeated until the differences between the theoretical output signals and the actual output signals are minimized.

29. An apparatus as recited in claim 17 wherein the processor compares the output signals to a set of previously generated theoretical output signals to find the closest match and wherein each one of the set of previously generated output signals corresponds to a different possible geometry of the periodic structure.

30. An apparatus as recited in claim 17 wherein the processor compares the output signals to a predetermined set of output signals to determine if a process is within specified tolerances.

31. An apparatus as recited in claim 17 wherein the probe beam spot is scanned with respect to the periodic structure and output signals are generated as a function of position.

32. An apparatus as recited in claim 31 wherein said processor filters the output signals generated during the scan using a repeated sequence of averaging and outlier exclusions wherein the outliers are defined by their differences with respect to signal levels and symmetry properties.

33. A method for evaluating the geometry of a periodic structure formed on a sample comprising the steps of:

focusing a probe beam of incoherent radiation to a spot on the sample surface in a manner so that the rays within the probe beam create a spread of angles of incidence and wherein the spot size on the sample is larger than the spacing between the features of the periodic structure so that the probe beam is diffracted upon reflection;

monitoring the light of the probe beam diffracted from the periodic structure and simultaneously generating a plurality of independent output signals corresponding to a plurality of different angles of incidence; and evaluating the geometry of the periodic structure on the sample based on the output signals.

34. A method as recited in claim 33 wherein probe beam is generated by a polychromatic light source.

35. A method as recited in claim 34 wherein a wavelength selective is filter located in the path of the probe beam.

36. A method as recited in claim 35 wherein said wavelength selective filter is a monochrometer.

37. A method as recited in claim 34 wherein the output signals correspond to a plurality of wavelengths.

38. A method as recited in claim 37 the output signals are generated at multiple wavelengths simultaneously.

39. A method as recited in claim 33 wherein the monitored probe beam light has illuminated at least twenty repetitive features of the periodic structure.

40. A method as recited in claim 33 wherein the size of the probe beam spot illuminates at least twenty repetitive features of the periodic structure.

41. A method as recited in claim 33 wherein the probe beam is passed through an analyzer and wherein the change in polarization state of the rays within the probe beam are monitored.

42. A method as recited in claim 33 wherein the step of evaluating the geometry of the periodic structure includes generating a set of theoretical output signals based on a theoretical profile of the periodic structure and wherein the theoretical output signals are compared with the actual output signals and thereafter generating another set of theoretical output signals based on the comparison and using a different theoretical profile of the periodic structure and wherein the comparison and generation steps are repeated until the differences between the theoretical output signals and the actual output signals are minimized.

43. A method as recited in claim 33 wherein the step of evaluating the geometry of the periodic structure includes comparing the output signals to a set of previously generated theoretical output signals to find the closest match and wherein each one of the set of previously generated output signals corresponds to a different possible geometry of the periodic structure.

44. A method as recited in claim 33 wherein the step of evaluating the geometry of the periodic structure includes comparing the output signals to a predetermined set of output signals to determine if a process is within specified tolerances.

45. A method as recited in claim 33 wherein the probe beam spot is scanned with respect to the periodic structure and output signals are generated as a function of position.

46. A method as recited in claim 45 wherein the step of evaluating the geometry of the periodic structure includes filtering the output signals generated during the scan using a repeated sequence of averaging and outlier exclusions wherein the outliers are defined by their differences with respect to signal levels and symmetry properties.

47. An apparatus for evaluating the geometry of a periodic structure formed on a sample comprising:

a light source for generating a probe beam;

an optical element for focusing the probe beam to a spot on the sample surface in a manner so that the rays within the probe beam create a spread of angles of incidence and wherein the spot size on the sample is larger than the spacing between the features of the periodic structure so that the probe beam is diffracted upon reflection;

a detector array for monitoring the light of the probe beam diffracted from the periodic structure, said detector array simultaneously generating a plurality of independent output signals corresponding to a plurality of different angles of incidence;

a movable stage for supporting the sample and permitting relative movement between the sample and the probe beam so that output signals can be generating as a function of position; and a processor for evaluating the geometry of the periodic structure on the sample based on the output signals generated by the detector.

48. An apparatus as recited in claim 47 wherein the light source is a laser beam.

49. An apparatus as recited in claim 47 wherein said processor filters the output signals using a repeated sequence of averaging and outlier exclusions wherein the outliers are defined by their differences with respect to signal levels and symmetry properties.

50. An apparatus as recited in claim 47 wherein said light source is an incoherent, polychromatic source.

51. An apparatus as recited in claim 50 further including a wavelength selective filter located between the light source and the detector array.

52. An apparatus as recited in claim 51 wherein said wavelength selective filter is a monochrometer.

53. An apparatus as recited in claim 52 wherein the detector array generates output signals corresponding to a plurality of wavelengths.

54. An apparatus as recited in claim 50 further including a dispersive element for spreading the wavelengths of light in the probe beam being diffracted from the sample and wherein the detector array is arranged to simultaneously generate output signals at multiple wavelengths.

55. An apparatus as recited in claim 47 wherein at least twenty repetitive features of the periodic structure are imaged by the detector array.

56. An apparatus as recited in claim 47 further including an analyzer and wherein the processor determines the change in polarization state of the rays within the probe beam to evaluate the geometry of the periodic structure on the sample.

57. An apparatus as recited in claim 47 wherein the optical element for focusing the probe beam is a lens.

58. An apparatus as recited in claim 47 wherein the probe beam is directed substantially normal to the sample.

59. An apparatus as recited in claim 47 wherein the processor functions to generate a set of theoretical output signals based on a theoretical profile of the periodic structure and wherein the theoretical output signals are compared with the actual output signals and thereafter, the processor generates another set of theoretical output signals based on the comparison and using a different theoretical profile of the periodic structure and wherein the comparison and generation steps are repeated until the differences between the theoretical output signals and the actual output signals are minimized.

60. An apparatus as recited in claim 47 wherein the processor compares the output signals to a set of previously generated theoretical output signals to find the closest match and wherein each one of the set of previously generated output signals corresponds to a different possible geometry of the periodic structure.

61. An apparatus as recited in claim 47 wherein the processor compares the output signals to a predetermined set of output signals to determine if a process is within specified tolerances.

62. A method for evaluating the geometry of a periodic structure formed on a sample comprising the steps of:

focusing a probe beam of radiation to a spot on the sample surface in a manner so that the rays within the probe beam create a spread of angles of incidence and wherein the spot size on the sample is larger than the spacing between the features of the periodic structure so that the probe beam is diffracted upon reflection;

translating the sample with respect to the probe beam;

monitoring the light of the probe beam diffracted from the periodic structure and simultaneously generating a plurality of independent output signals corresponding to a plurality of different angles of incidence as a function of position of the probe beam with respect to the periodic structure; and evaluating the geometry of the periodic structure on the sample based on the output signals.

63. A method as recited in claim 62, wherein the probe beam is generated by a laser.

64. A method as recited in claim 62 wherein the step of evaluating the geometry of the periodic structure includes filtering the output signals generated using a repeated sequence of averaging and outlier exclusions wherein the outliers are defined by their differences with respect to signal levels and symmetry properties.

65. A method as recited in claim 62, wherein the probe beam is generated by an incoherent polychromatic source.

66. A method as recited in claim 65 wherein a wavelength selective filter is located in the path of the probe beam.

67. A method as recited in claim 66 wherein said wavelength selective filter is a monochrometer.

68. A method as recited in claim 65 wherein the output signals correspond to a plurality of wavelengths.

69. A method as recited in claim 68 the output signals are generated at multiple wavelengths simultaneously.

70. A method as recited in claim 62 wherein the monitored probe beam light has illuminated at least twenty repetitive features of the periodic structure.

71. A method as recited in claim 62 wherein the probe beam is passed through an analyzer and wherein the change in polarization state of the rays within the probe beam are monitored.

72. A method as recited in claim 62 wherein the step of evaluating the geometry of the periodic structure includes generating a set of theoretical output signals based on a theoretical profile of the periodic structure and wherein the theoretical output signals are compared with the actual output signals and thereafter generating another set of theoretical output signals based on the comparison and using a different theoretical profile of the periodic structure and wherein the comparison and generation steps are repeated until the differences between the theoretical output signals and the actual output signals are minimized.

73. A method as recited in claim 62 wherein the step of evaluating the geometry of the periodic structure includes comparing the output signals to a set of previously generated theoretical output signals to find the closest match and wherein each one of the set of previously generated output signals corresponds to a different possible geometry of the periodic structure.

74. A method as recited in claim 62 wherein the step of evaluating the geometry of the periodic structure includes comparing the output signals to a predetermined set of output signals to determine if a process is within specified tolerances.

75. An apparatus for evaluating the geometry of a periodic structure formed on a sample comprising:

a light source for generating a probe beam;

an optical element for focusing the probe beam to a spot on the sample surface in a manner so that the rays within the probe beam create a spread of angles of incidence and wherein the spot size on the sample is larger than the spacing between the features of the periodic structure so that the probe beam is diffracted upon reflection;

detector means for monitoring the light of the probe beam diffracted from the periodic structure, said detector means simultaneously generating a plurality of independent output signals corresponding to a plurality of different angles of incidence;

means for create relative movement between the sample and the probe beam so that output signals can be generating as a function of position; and a processor for evaluating the geometry of the periodic structure on the sample based on the output signals generated by the detector.

76. An apparatus as recited in claim 75 wherein the light source is a laser beam.

77. An apparatus as recited in claim 76 wherein said processor filters the output signals using a repeated sequence of averaging and outlier exclusions wherein the outliers are defined by their differences with respect to signal levels and symmetry properties.

78. An apparatus as recited in claim 75 wherein said light source is an incoherent, polychromatic source.

79. An apparatus as recited in claim 78 further including a wavelength selective filter located between the light source and the detector means.

80. An apparatus as recited in claim 78 wherein the detector means generates output signals corresponding to a plurality of wavelengths.

81. An apparatus as recited in claim 75 further including an analyzer and wherein the processor determines the change in polarization state of the rays within the probe beam to evaluate the geometry of the periodic structure on the sample.

82. An apparatus as recited in claim 75 wherein the processor functions to generate a set of theoretical output signals based on a theoretical profile of the periodic structure and wherein the theoretical output signals are compared with the actual output signals and thereafter, the processor generates another set of theoretical output signals based on the comparison and using a different theoretical profile of the periodic structure and wherein the comparison and generation steps are repeated until the differences between the theoretical output signals and the actual output signals are minimized.

83. An apparatus as recited in claim 75 wherein the processor compares the output signals to a set of previously generated theoretical output signals to find the closest match and wherein each one of the set of previously generated output signals corresponds to a different possible geometry of the periodic structure.

84. An apparatus as recited in claim 75 wherein the processor compares the output signals to a predetermined set of output signals to determine if a process is within specified tolerances.

* * * * *